United States Patent [19]

Kanba et al.

[11] Patent Number: 5,631,624

[45] Date of Patent: May 20, 1997

[54] DIELECTRIC CERAMICS AND ELECTRONIC PARTS USING THE SAME

[75] Inventors: Seiji Kanba; Kazuya Kawabata; Hiroshi Takagi, all of Nagaokakyo, Japan

[73] Assignee: Murata Manufacturing Co., Ltd., Japan

[21] Appl. No.: 519,752

[22] Filed: Aug. 28, 1995

Related U.S. Application Data

[63] Continuation of Ser. No. 61,510, May 14, 1993, abandoned, which is a continuation of Ser. No. 868,834, Apr. 15, 1992, abandoned.

[30] Foreign Application Priority Data

Apr. 19, 1991 [JP] Japan ..................... 3-116917
Feb. 20, 1992 [JP] Japan ..................... 4-33235

[51] Int. Cl.$^6$ ..................................... H01C 1/14
[52] U.S. Cl. .................... 338/309; 338/322; 29/621; 501/134; 501/135; 501/136; 501/137
[58] Field of Search .................. 252/62.9; 501/134, 501/135, 136, 137, 152; 428/209, 210, 426, 432, 901; 361/401; 338/322, 323, 309, 310, 311; 29/621

[56] References Cited

U.S. PATENT DOCUMENTS

| | | | |
|---|---|---|---|
| 2,063,357 | 12/1936 | Williams | 338/322 |
| 2,648,804 | 8/1953 | Steigerwalt et al. | 361/402 |
| 4,215,333 | 7/1980 | Huang | 338/322 |
| 4,759,965 | 7/1988 | Kato et al. | 428/138 |
| 4,952,538 | 8/1990 | Kumagai et al. | 501/136 |
| 5,335,139 | 8/1994 | Nomura et al. | 501/137 |

FOREIGN PATENT DOCUMENTS

| | | | |
|---|---|---|---|
| 0044225 | 11/1974 | Japan | 501/137 |
| 0001400 | 1/1975 | Japan | 501/137 |

OTHER PUBLICATIONS

*Introduction to Ceramics* Kingery et al. (1976) John Wiley & Sons pp. 968–969.

*Primary Examiner*—Paul Marcantoni
*Attorney, Agent, or Firm*—Ostrolenk, Faber, Gerb & Soffen, LLP

[57] ABSTRACT

A dielectric ceramics contains, at least, two kinds of metal ions and a dielectric constant changes continuously or step by step as a function of position. The metal ions contained in the dielectric ceramics are, at least, two kinds which are selected from Mg, Ca, Sr, Ba, Zn, Pb, Bi, Y, La, Ce, Nd, Sm, Gd, Er, Ti, Zr, Sn, Si and Mn, and the dielectric constant $\epsilon$ changes in the range of $7 \leq \epsilon \leq 90$. This dielectric ceramics is used in a dielectric substrate for stripline device, a dielectric substrate for monolithic IC and a dielectric block for polarizer. For example, when used as the dielectric substrate for stripline device, it is so formed that a dielectric constant at its center portion is constant, and that those at an outer portion becomes smaller step by step or continuously towards ends. In the case of forming a stripline on the dielectric substrate, when characteristic impedance is constant, a line width at a center portion of the dielectric substrate is narrow and it becomes wider towards ends.

19 Claims, 14 Drawing Sheets

F I G.12(A)
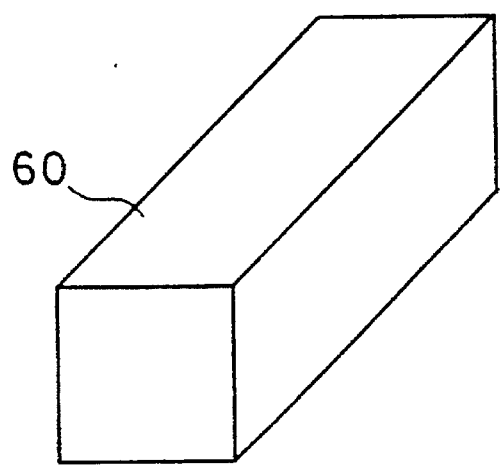
F I G.12(B)
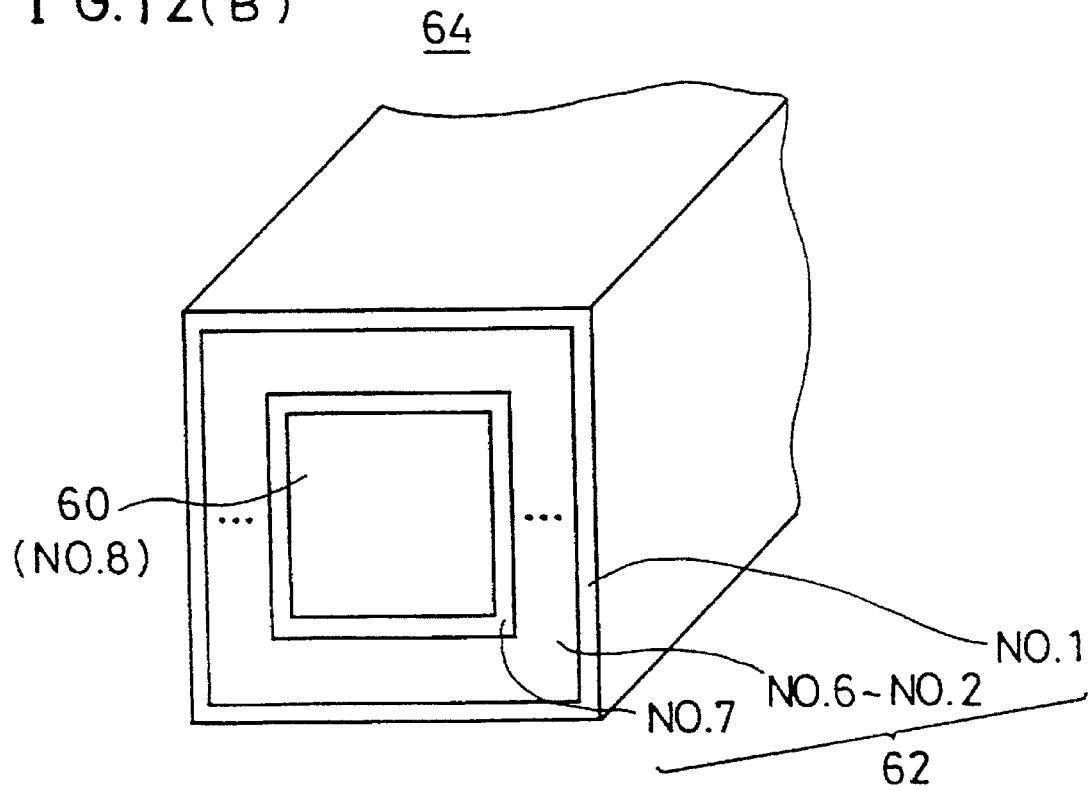

F I G. 16 (A)
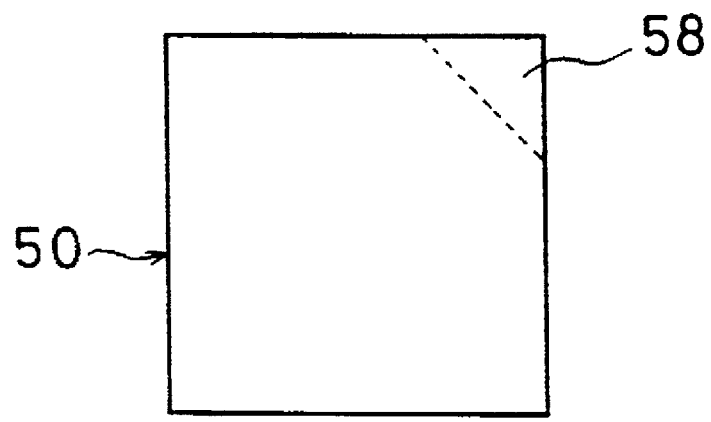
F I G. 16 (B)
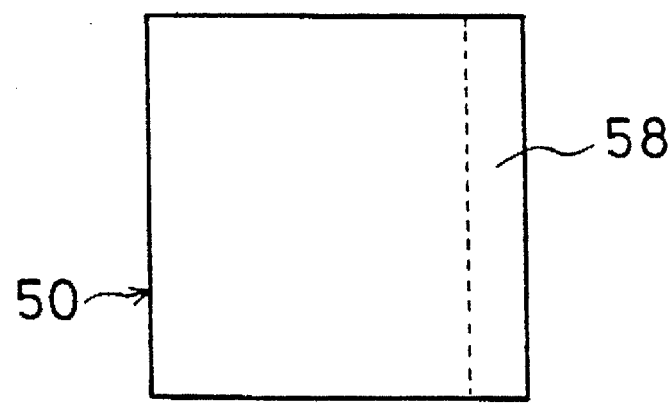

F I G. 17
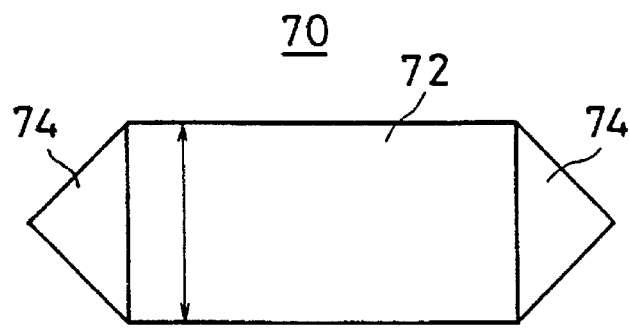
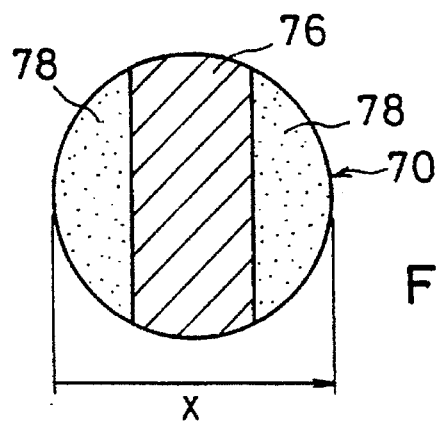
F I G. 18 (A)
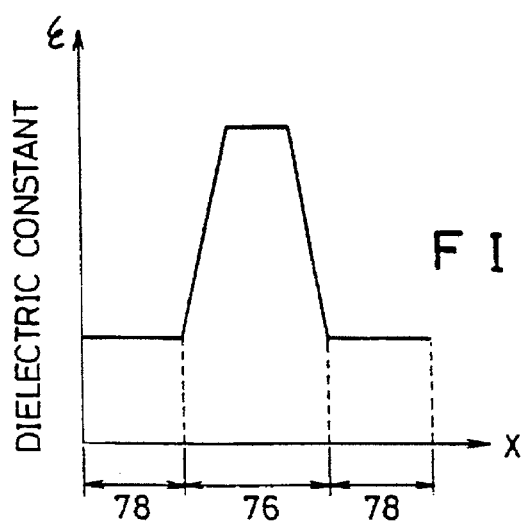
F I G. 18 (B)

FIG. 19
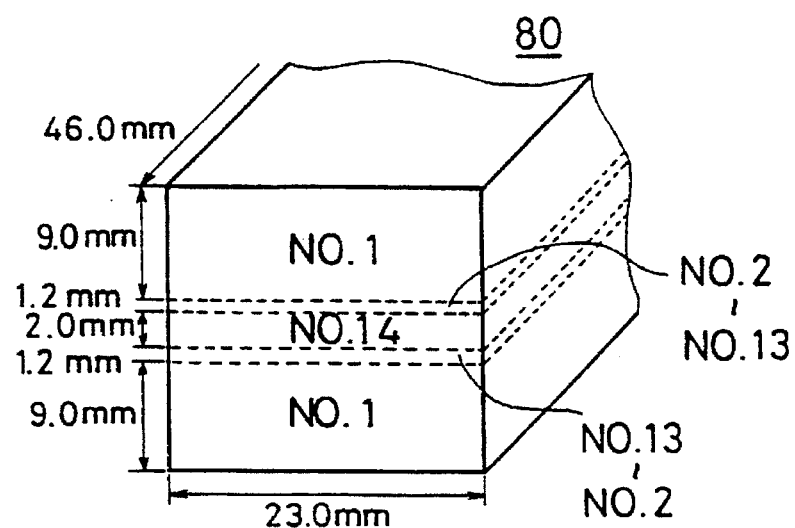
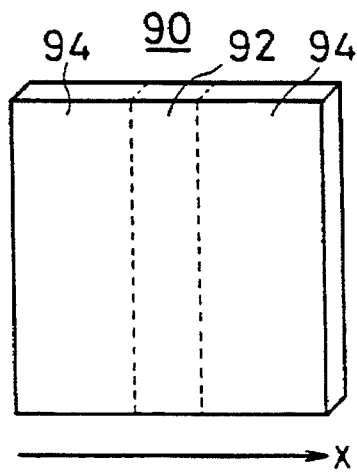
FIG. 20(A)
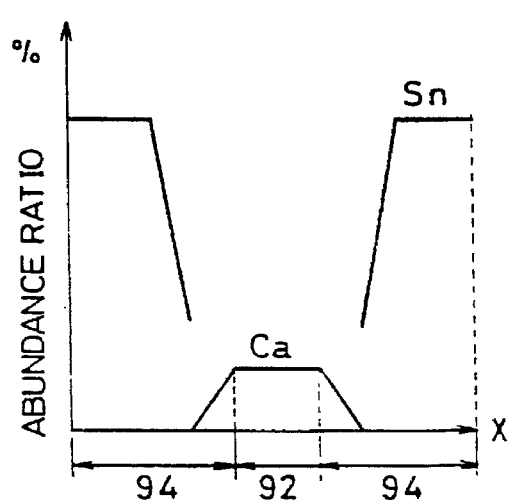
FIG. 20(B)

FIG. 21
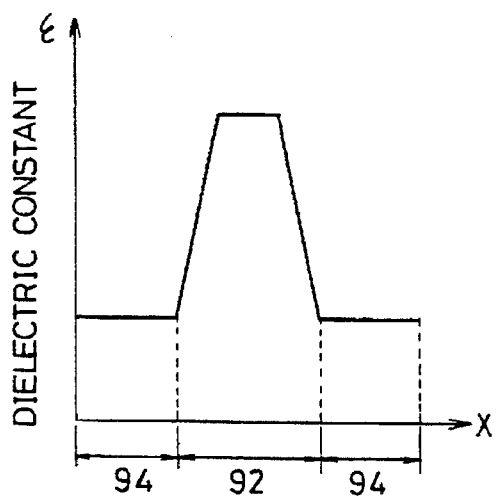
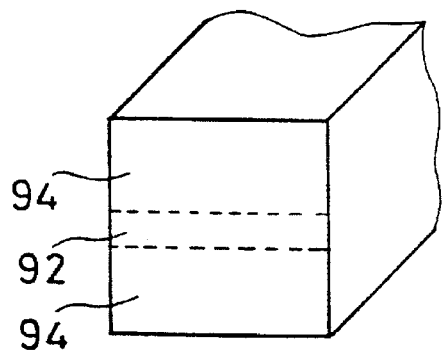
FIG. 22(A)
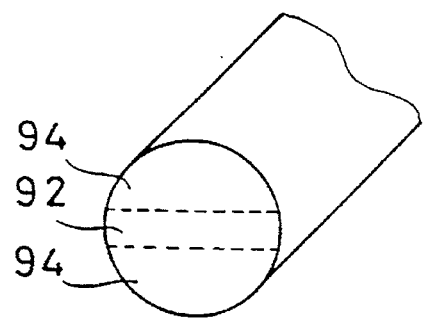
FIG. 22(B)

FIG. 23
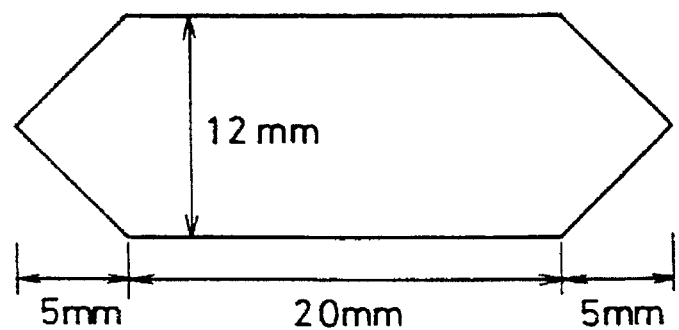
FIG. 24(A)  FIG. 24(C)
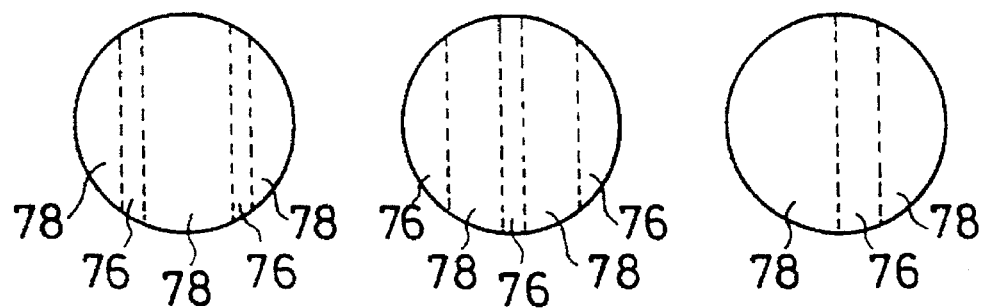
FIG. 24(B)

F I G. 25(A)
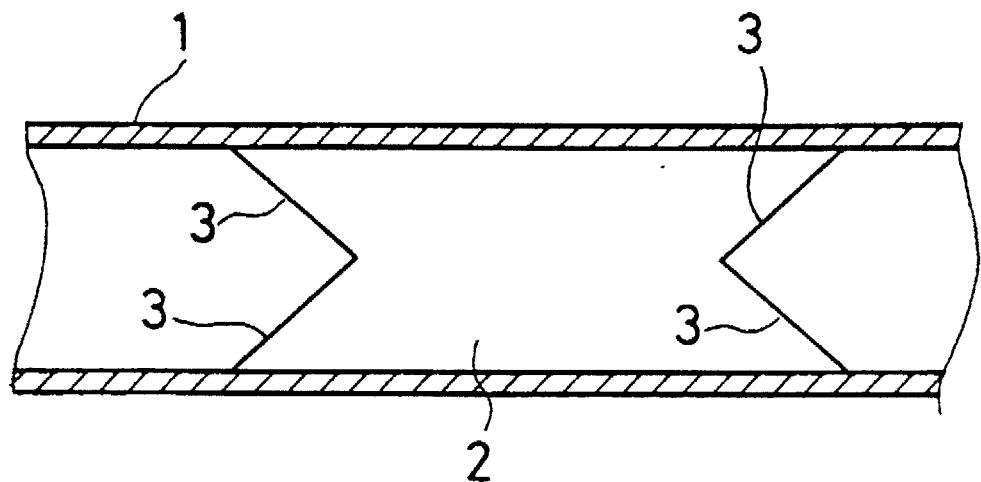
F I G. 25(B)
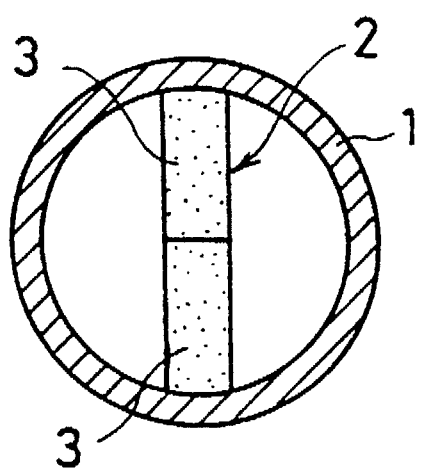

DIELECTRIC CERAMICS AND ELECTRONIC PARTS USING THE SAME

This is a Continuation of application Ser. No. 08/061,510 filed on May 14, 1993, now abandoned, which is a Continuation of application Ser. No. 07/868,834, filed Apr. 15, 1992, now abandoned.

BACKGROUND OF THE INVENTION

1. Field of the Invention

The present invention relates to a dielectric ceramic and electronic parts using the same, and particularly, to the dielectric ceramics which are applied, for example, in a micro-stripline device, a monolithic IC, a polarizer and so on, and the electronic parts using the dielectric ceramics.

2. Description of the Prior Art

Conventionally, as a dielectric ceramic used in electronic parts, those having a uniform composition and a uniform dielectric constant distribution have been used.

For example, as a dielectric substrate used in a conventional micro-stripline device, there was the dielectric substrate having a uniform composition structure in which such material as alumina and fluororesin having a dielectric constant of 10 or so are used.

In such a dielectric substrate, by increasing the dielectric constant, the micro-stripline device or the substrate can be miniaturized. However, when the dielectric constant is increased, a width of stripline must also be narrowed in order to satisfy a characteristic impedance standard.

When considering miniaturization of the stripline device with the conventional dielectric substrate, under the condition of 1 mm substrate thickness and 50 $\Omega$ characteristic impedance, a necessary line width of about 1.0 mm for the substrate of dielectric constant of 10. On the other hand, a necessary line width for the substrate of dielectric constant of 30 is about 0.2 mm. Accordingly, when miniaturizing by increasing the dielectric constant of the substrate, the line width becomes so narrow that it is difficult to contact to external circuits at input/output terminals.

Similarly, when the substrate having the uniform composition is used as the monolithic IC substrate, the line width formed on the substrate is determined by the characteristic impedance. Therefore, when the dielectric constant of the substrate is increased to reduce the line width, it is difficult to make contact to the external circuits.

While, in a satellite broadcasting system, as shown in FIGS. 25(A) and (B), a polarizer comprising a waveguide 1 into which a dielectric plate 2 having a dielectric constant of about 10 is inserted was used. This dielectric plate 2 is that, the dielectric constant of the dielectric plate in an axial direction of the waveguide is changed continuously by forming V-shaped inclined portions 3 at its opposite ends. As such, by changing the dielectric constant of the dielectric plate, when an electric wave is incided to the polarizer or radiated from the polarizer, reflection of the electric wave at a border of the dielectric plate and air is prevented.

Also, in this polarizer, it can be miniaturized by using the ceramics having the high dielectric constant for the dielectric plate. However, when the ceramics having the high dielectric constant is used, a difference of dielectric constant between air and the dielectric plate becomes larger, and a propagation wave such as an interface wave is produced at the border between the air and dielectric plate, results in increasing a transmission loss.

SUMMARY OF THE INVENTION

It is, therefore, a primary object of the present invention to provide a dielectric ceramics which is able to be miniaturized and contacted to external circuits when used in a micro-stripline device, a monolithic IC or the like, and capable of miniaturization and reducing a transmission loss when used in a polarizer or the like, and further, it is an object thereof to provide electronic parts using the dielectric ceramics.

The present invention is directed to the dielectric ceramics which contain, at least, two kinds of metal ions, and in which a dielectric constant changes continuously or step by step as a function of position.

In the dielectric ceramics, the metal ions are, at least, two kinds selected from Mg, Ca, Sr, Ba, Zn, Pb, Bi, Y, La, Ce, Nd, Sm, Gd, Er, Ti, Zr, Sn, Si and Mn, and the dielectric constant $\epsilon$ changes the range of $7 \leq \epsilon \leq 90$.

By using the ceramics of the present invention, a dielectric substrate, in which in one direction or in all directions which are parallel to a surface, the dielectric constant is uniform near a center portion and becomes smaller step by step or continuously towards ends is formed.

On the dielectric substrate, a conductive line which is parallel to the main surface can be formed on the surface or inside thereof, and further, at a portion where the dielectric constant is reduced, a conductive portion whose width becomes wider towards the ends is formed.

A polarizer can also be formed by using the ceramics of the present invention. In this case, the dielectric ceramics is formed into a shape, where conical portions are formed at opposite ends of a circular column or pyramidal portions are formed at opposite ends of a square column. And, in one direction which is parallel to a surface orthogonal to the axial direction of the circular or square column, the dielectric constant is changed continuously or step by step.

Since there is a portion on the dielectric ceramics where the dielectric constant changes continuously or step by step, in the case of forming a stripline having a constant characteristic impedance on the dielectric substrate by using the dielectric ceramics, a line width changes responsive to the change of dielectric constant.

In the polarizer using the dielectric ceramics, since there is no interface where the difference of dielectric constant occurs between air and the dielectric plate as in the past, a propagation wave is hardly produced at such an interface.

According to the present invention, even in the case of forming the stripline having the constant characteristic impedance, the line width changes with the location. Accordingly, since the stripline width at end of the dielectric substrate can be widen, it is possible to contact to the external circuits.

Furthermore, in the case of manufacturing a polarizer by using the dielectric ceramics, since there is a portion where the dielectric constant is high, the polarizer can be miniaturized. Besides, since the dielectric constant of the dielectric ceramics changed continuously or step by step, there is no portion where the difference of dielectric constant is large, results in a little transmission loss.

The above and other objects, features, aspects and advantages of the present invention will becomes more apparent from the following detailed description of the embodiments made with reference to the drawings.

BRIEF DESCRIPTION OF THE DRAWINGS

FIG. 12(A) is a perspective view showing a block formed by one kind of raw material, and FIG. 12(B) is an explanatory view showing a structural body obtained by dipping the block into a slurry including a plurality of raw materials.

FIG. 16(A) and FIG. 16(B) are explanatory views showing modified examples of the dielectric substrate shown in FIG. 11.

FIG. 17 is a plan view showing an example of dielectric block of a polarizer using a dielectric ceramic of the present invention.

FIG. 18(A) is an explanatory view showing a section of the dielectric block shown in FIG. 17, and FIG. 18(B) is a graph showing a distribution state of its dielectric constant.

FIG. 19 is an explanatory view showing a laminate in which a green sheet formed by a plurality of raw materials is laminated to obtain the dielectric block shown in FIG. 17.

FIG. 20(A) is an explanatory view showing a sample obtained by firing and cutting the laminate shown in FIG. 19, and FIG. 20(B) is a graph showing a composition distribution of the sample.

FIG. 21 is a graph showing a distribution state of a dielectric constant of a sinter obtained by firing the laminate shown in FIG. 19.

FIG. 22(A) is a fragmentary explanatory view of a sintered body obtained by firing the laminate shown in FIG. 19, and FIG. 22(B) is a fragmentary explanatory view showing a columnar rod obtained by grinding the sinter.

FIG. 23 is a plan view showing a dielectric plate formed as a comparative example.

FIG. 24(A), FIG. 24(B) and FIG. 24(C) are sectional explanatory views showing modified examples of the dielectric block shown in FIG. 17.

FIG. 25(A) is a explanatory plan view showing an example of conventional polarization transducer, and FIG. 25(B) is its sectional explanatory view.

DESCRIPTION OF THE PREFERRED EMBODIMENTS

Figure 1:
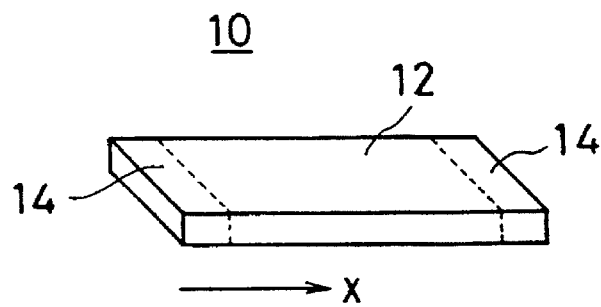
FIG. 1 is an explanatory view showing one embodiment of a dielectric substrate using a dielectric ceramic of the present invention.

FIG. 1 is an explanatory view showing one embodiment of the present invention. A dielectric substrate 10 is formed by compositions containing, at least, two or more kinds of metal ions selected from Mg, Ca, Sr, Ba, Zn, Pb, Bi, Y, La, Ce, Nd, Sm, Gd, Er, Ti, Zr, Sn, Si and Mn. The dielectric substrate 10 is constituted by a center portion 12 which is inside the portions indicated by dotted lines of FIG. 1, and outer portions 14 which are outside the portion indicated by the dotted lines. The center portion 12 and the outer portions 14 are formed integrally.

Figure 2:
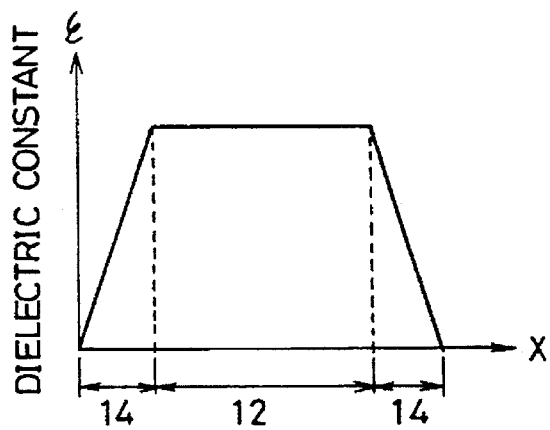
FIG. 2 is a graph showing a distribution state of a dielectric constant of the dielectric substrate shown in FIG. 1.

The center portion 12 is formed such that its composition is uniform, and the outer portions 14 are formed such that the composition differs with locations. The outer portions 14 are that, the composition is distributed such that a dielectric constant $\epsilon$ becomes smaller in the range of $7 \leq \epsilon \leq 90$ towards ends from the center portion 12. This composition distribution may be changed step by step or continuously. Accordingly, in a direction shown by the arrow X, a distribution state of the dielectric constant from one end to the other end of the dielectric substrate 10 is, as shown in FIG. 2, constant at the center portion 12 and inclined at the outer portions 14.

Usually, in the case of forming a stripline on the dielectric substrate, when the dielectric constant is $\epsilon$, stripline width is W, characteristic impedance is Z and dielectric substrate thickness is t, the following relationship is established therebetween.

$$Z=60A^{-0.5}ln(8t/W+0.25W/t) \text{ (in case of } W/t \leq 1)$$

$$Z=120\pi A^{-0.5}\{W/T+1.393+0.667ln(W/t+1.444)\}^{-1} \text{ (in case of } W/t \geq 1)$$

Here, A is obtained as, $$A=0.5(\epsilon+1)+0.5(\epsilon-1) F(W/t),$$

and F/(W/t) is obtained as, $$F(W/t)=(1+12t/W)^{-0.5}+0.04(1-W/t)^2 \text{ (in case of } W/t \leq 1)$$

$$F(W/t)=(1+12t/W)^{-0.5} \text{ (in case of } W/t \geq 1)$$

For example, under the condition where the characteristic impedance Z is 50 $\Omega$ and the substrate thickness is 1 mm, the relationship between the dielectric constant $\epsilon$ and the stripline width W is as shown in Table 1. As it is clear from Table 1, by increasing the dielectric constant $\epsilon$ of the dielectric substrate 10, a stripline width W necessary for achieving a certain characteristic impedance becomes narrower.

Figure 3:
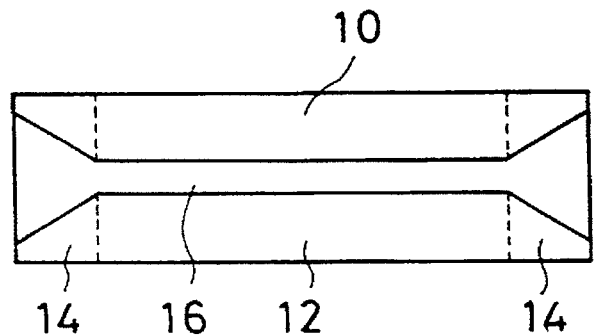
FIG. 3 is a plan view showing a state wherein a stripline electrode is formed on the dielectric substrate shown in FIG. 1.

From such a relationship between the dielectric constant and stripline width, in the case of forming an electrode on the dielectric substrate 10 wherein the characteristic impedance is equal at every points on the stripline, a size of the electrode 16 is to be formed such that is becomes larger at its ends as shown in FIG. 3. Accordingly, a coaxial cable and so on can be bonded at an enlarged conductive portion of the electrode 16. Though, not shown, an earth electrode is formed throughout the rear surface of the dielectric substrate 10.

As embodiments, dielectric ceramic compositions which are able to respond to the change of desired dielectric constant were prepared on the basis of following mixed crystal material groups, or by combining them or producing substituents thereof.

| | |
|---|---|
| $BaO—Pb_3O_4—Nd_2O_3—TiO_2$ group | $\epsilon = 37$–$90$ |
| $CaO—MgO—TiO_2$ group | $\epsilon = 17$–$170$ |
| $SnO_2—TiO_2$ group | $\epsilon = 9$–$104$ |
| $MgO—TiO_2—SiO_2$ group | $\epsilon = 6$–$17$ |

Specifically, $MgCO_3$, $CaCO_3$, $BaCO_3$, $Nd_2O_3$, $TiO_2$, $SiO_2$ and $Pb_3O_4$ were prepared as green raw materials, which were weighed in the ratio shown in Table 2, mixed and pulverized in a wet ball mill to obtain nine kinds of powdery mixed raw materials.

The mixed raw materials were calcined in the air at 1150° C. for two hours, then pulverized by a dry grinder to obtain calcined powder having a mean particle diameter of 1.5 μm. An organic solvent comprising ethanol and toluene at 8:2 by volume, a polyvinylbutyral group binder, a dioctyl phthalate group plasticizer and a solubitane fatty acid ester group dispersant were mixed to the calcined powders to obtain slurries. Using these slurries nine kinds of green sheet were prepared by a doctor blade method.

For measuring simple substance characteristic, each of nine kinds of green sheet was laminated, and, after being subjected to heat press, cut into a molded body of 10×10×0.5 (mm). After burning organic components of the nine kinds of molded body obtained in the air at 500° C., fired in an oxygen atmosphere at 1350° C. for two hours to obtain a sintered body. In-Ga electrodes were formed on these nine kinds of sintered body and respective dielectric constants were measured. The results are as shown in Table 2.

Figure 4A:
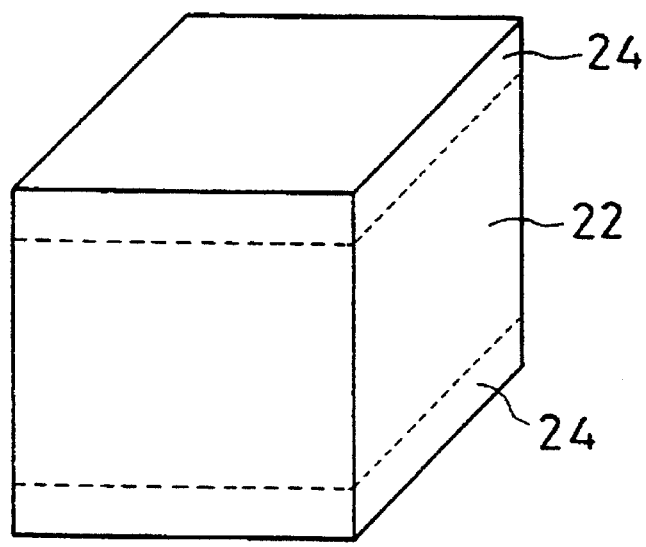
FIG. 4(A) is an explanatory view showing a block formed by laminating green sheets for producing a dielectric substrate of the present invention.
Figure 4B:
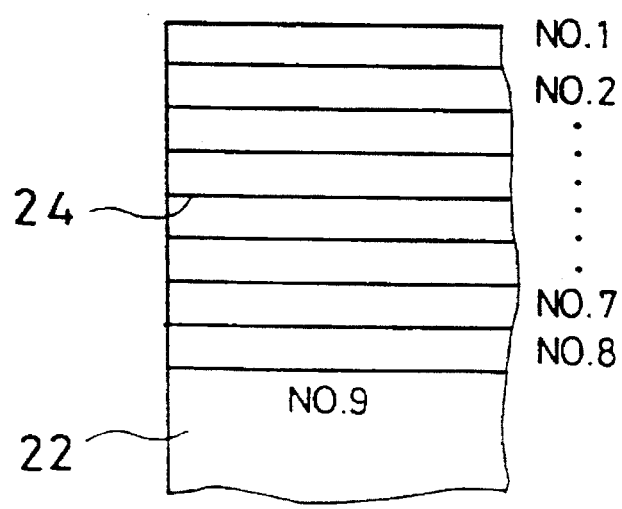
FIG. 4(B) is an explanatory view showing an end portion of the block.
Figure 5:
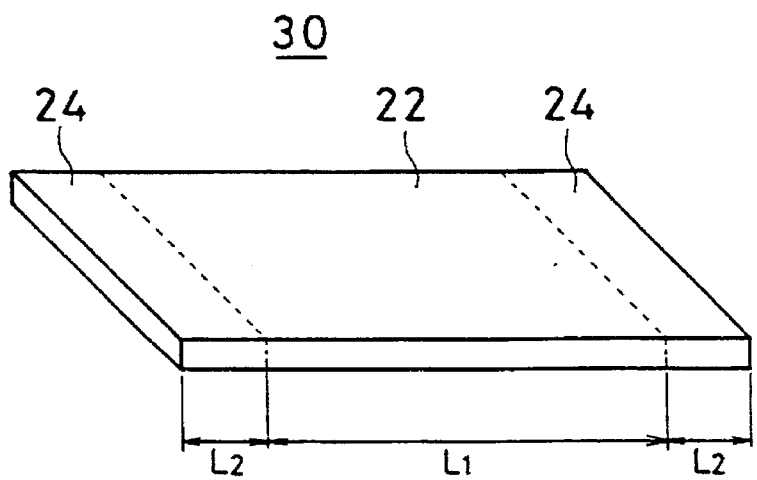
FIG. 5 is an explanatory view showing a molded body formed by cutting the block shown in FIG. 4.

Next, for obtaining a dielectric substrate of the present invention, green sheets formed by the raw materials of No. 1 to No. 9 in Table 2 were laminated and subjected to heat press to form block 20 as shown in FIG. 4(A). At this time, a center portion 22 of the block 20 was formed by the green sheet which is formed by the raw material of No. 9, and end portions 24 were formed by laminating the green sheets which are formed by the raw materials of No. 1 to No. 8 as shown in FIG. 4(B). This block was cut to obtain a molded body 30 of 5.0×13.2×1.5 (mm) as shown in FIG. 5. In the molded body 30, a length $L_1$ of the portion 22 formed by the raw materials of No. 9 was 10.0 mm, and a length $L_2$ of the end portions 24 formed by the raw materials of No. 1 to No. 8 was 1.6 mm.

Figure 6A:
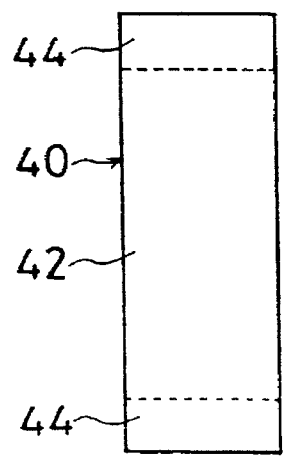
FIG. 6(A) is an explanatory view showing a sinter produced by firing the molded body shown in FIG. 5.
Figure 6B:
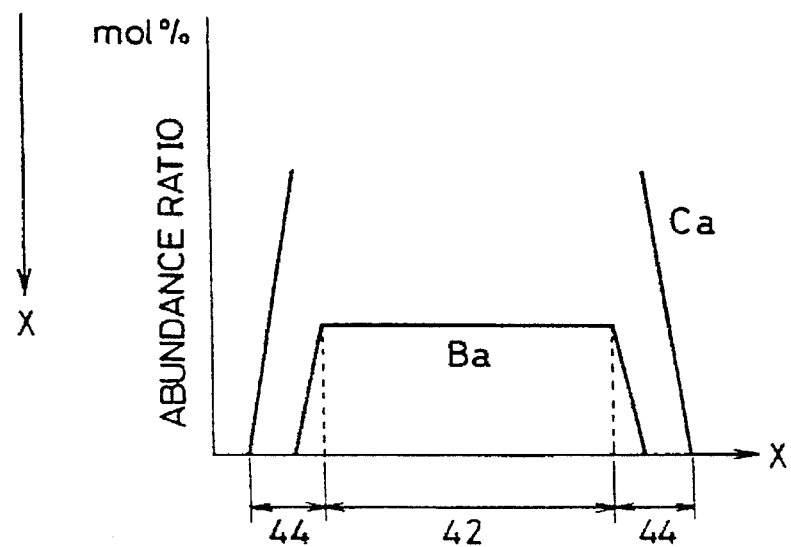
FIG. 6(B) is a graph showing its composition distribution.
Figure 7:
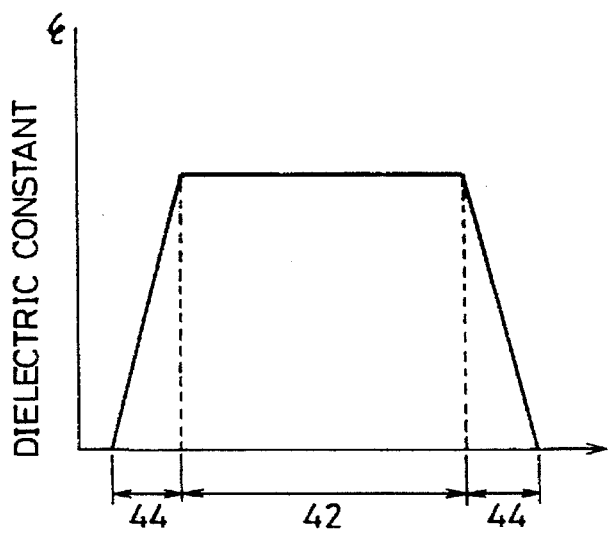
FIG. 7 is a graph showing a distribution state of a dielectric constant of the sintered body shown in FIG. 6.

After burning organic components of the molded body 30 thus obtained in the air at 500° C., fired in an oxygen atmosphere at 1350° C. for two hours to obtain a sinter 40. For the sintered body 40, composition analysis (line analysis) of Ca and Ba was carried out by using an X-ray microanalyzer in a direction shown by the arrow X in FIG. 6(A). As a result, it was found that the sinter 40 has a uniform composition distribution at a center portion 42 and an inclined composition distribution at end portions 44 as shown in FIG. 6(B). From data related to this composition distribution and data related to the dielectric constant of the simple substance, it was found that an inclined dielectric constant structure as shown in FIG. 7 is formed in the sinter.

Figure 8:
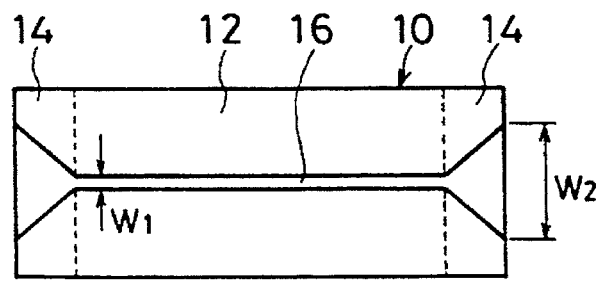
FIG. 8 is a plan view showing a state wherein a stripline electrode is formed on the dielectric substrate shown in FIG. 1.

The obtained sintered body was ground to obtain a dielectric substrate 10. An Ag electrode was formed throughout one main surface of the dielectric substrate 10. Then, taking into consideration of the dielectric constant characteristic and composition inclination of the dielectric substrate 10, a strip electrode 16 as shown in FIG. 8 was formed on the other main surface of the dielectric substrate 10 so as to show characteristic impedance of 50 Ω. A width $W_1$ of the stripline electrode 16 formed at the center portion 12 of the dielectric substrate is 0.08 mm, and a width $W_2$ of utmost of the stripline electrode 16 formed on the outer portions 14 is 0.60 mm.

Figure 9:
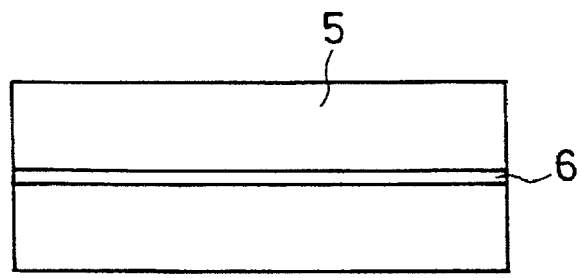
FIG. 9 is a plan view showing a stripline device produced for comparison with a dielectric substrate of the present invention.

For comparison, a dielectric substrate 5 having a substrate dielectric constant 65 was prepared by using the mixed raw materials of No. 9 in Table 2 as shown in FIG. 9. Thickness of the dielectric substrate 5 is 1 mm. A strip electrode 6 having a fixed width of 0.08 mm was formed on the dielectric substrate 5. Characteristic impedance of the strip electrode 6 is also 50 Ω as same as the aforementioned embodiment. Results of soldering copper wires of 0.1 mm, 0.3 mm, 0.5 mm and 1.0 mm diameter to the strip electrode ends of the two devices are shown in Table 3. In Table 3, a symbol O indicates that the soldering is possible and a symbol X indicates that the soldering is impossible.

As such, when the dielectric substrate of the present invention is used, since the microstrip electrode ends can be enlarged, it is possible to use these portions as the conductive portion for bonding a coaxial cable and so on.

Figure 10:
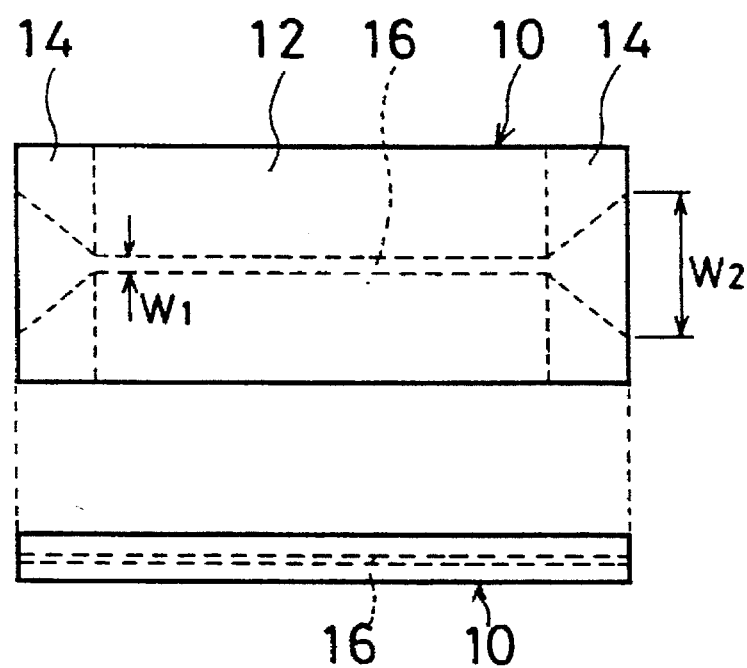
FIG. 10 is a plan view and a front view showing a modified example of the stripline device shown in FIG. 3.

In the above-mentioned embodiment, though the stripline was formed on the surface of the dielectric substrate 10, as a similar construction a line 16 may also be formed within the dielectric substrate 10 as shown in FIG. 10. Though, not shown in FIG. 10, an earth electrode is formed throughout one main surface or the other main surface of the dielectric substrate 10.

The dielectric substrate of the present invention is also applicable as a dielectric substrate for those such as a suspended strip, cone-planer strip and a slot guide, besides the micro-stripline device as the above-mentioned embodiment, and is effective as the micro-stripline device.

Figure 11A:
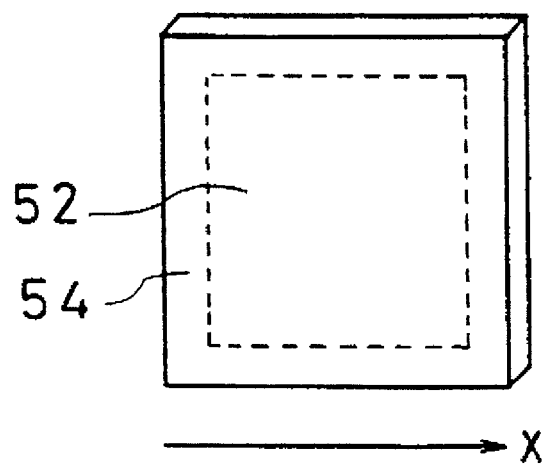
FIG. 11(A) is an explanatory view showing an example of dielectric substrate for use in a monolithic IC using a dielectric ceramic of the present invention.
Figure 11B:
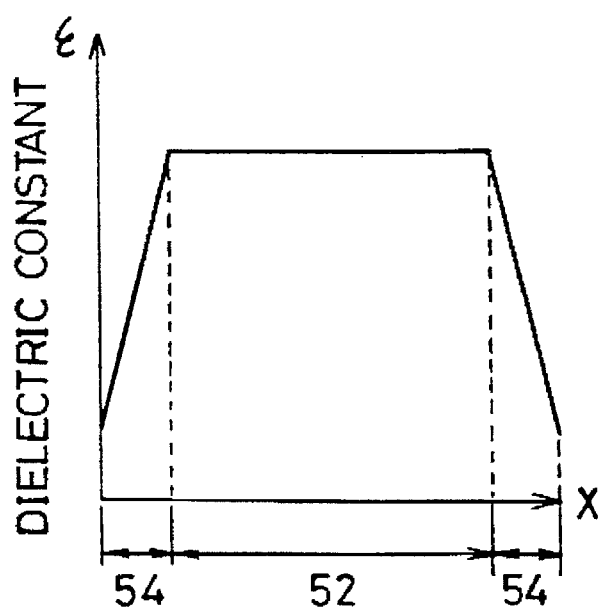
FIG. 11(B) is a graph showing distribution state of its dielectric constant.

Such a dielectric substrate can also be used as a monolithic IC substrate. In this case, as shown in FIG. 11(A) and FIG. 11(B), a dielectric substrate 50 is formed such that a dielectric constant at its center portion 52 is uniform and a dielectric constant at an outer portion 54 becomes smaller towards the periphery. Even in such dielectric substrate 50, as same as the dielectric substrate 10 shown in FIG. 1, it is possible to reduce a line width formed at the center portion 52 and to widen a width of the conductive portion formed at the outer portion 54. Accordingly, when the dielectric substrate 50 is used, it is possible to miniaturize the monolithic IC and to contact to the external circuits.

For manufacturing such dielectric substrate 50, $CaCO_3$, $MgCO_3$, $TiO_2$ and $ZrO_2$ having a mean particle diameter of 1 to 2 μm and a purity of 99% or more were prepared as green raw materials. The green raw materials were weighed in the ratio shown in Table 4 to obtain eight kinds of mixed raw materials.

The mixed raw materials were calcined in the air at 1150° C. for two hours to prepare a green sheet in a same manner as producing the dielectric substrate 10 shown in FIG. 1. Each of the green sheet was laminated and subjected to heat press to obtain eight kinds of molded body. The molded body thus obtained was fired in the air at 1370° C. for two hours to obtain a sintered body, after burning organic components in the air at 400° C. The obtained sintered body was cut into a size of 10×10×0.5 (mm) and an In-Ga electrode was formed, then the dielectric constants were measured. The results are shown in Table 4.

Next, for obtaining the dielectric substrate 50 shown in FIG. 11(A), a green sheet using the raw materials of No. 8 was laminated to obtain a block 60 of 20×20×50 (mm) as shown in FIG. 12(A).

The block 60 thus obtained was heated at 150° C. by a heater, dipped into a slurry using the raw materials of No. 7 for two seconds and pulled out and dried by hot air. Then, by an isostatic press the block 60 and the slurry using the raw materials of No. 7 were acclimatized. Such operations were carried out in order from the slurry using the raw materials of No. 7 to those using the raw materials of No. 1. By such a process, a structural body 64 whose composition at a center portion 60 is uniform and those at an outer portion 62 changes towards the end portions was obtained as shown in FIG. 12(B). A thickness of the outer portion 62 of the structural body 64 is 1 mm.

The structural body 64 thus obtained was fired in the air at 1370° C. for two hours, after burning organic components in the air at 400° C., to obtain a block-shaped sintered body of 15×15×37 (mm). The sintered body was sliced by a diamond cutter and ground to obtain a dielectric substrate 50 for monolithic IC shown in FIG. 11(A). A size of the dielectric substrate 50 is 15×15×1 (mm).

Figure 13:
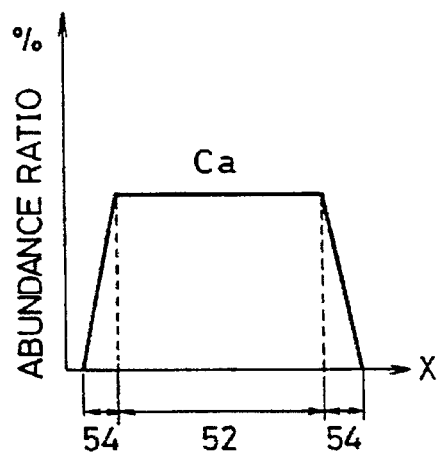
FIG. 13 is a graph showing a distribution state of dielectric constant of the dielectric substrate shown in FIG. 11.

For the obtained dielectric substrate 50, composition analysis (line analysis) of Ca was carried out in a direction shown by the arrow X in FIG. 11(A) by using an X-ray microanalyzer. As a result, it was found that a composition distribution is as shown in FIG. 13. Furthermore, it was found from the composition distribution and dielectric constant characteristics of the simple substance, that the dielectric substrate 50 has an inclined dielectric constant structure as shown in FIG. 11(B).

Figure 14:
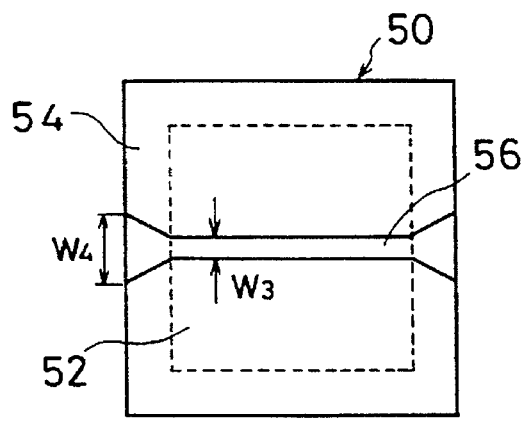
FIG. 14 is a plan view showing a state wherein a stripline is formed on the dielectric substrate shown in FIG. 11.

An Ag electrode was formed throughout one main surface of the dielectric substrate 50. While, taking into consideration of the dielectric constant characteristics and composition inclination of the dielectric substrate 50, a strip electrode 56 as shown in FIG. 14 was formed on the other main surface of the dielectric substrate 50 so as to show the characteristic impedance of 50 Ω. Here, a width $W_3$ of the strip electrode 56 formed at a center portion 52 of the dielectric substrate 50 is 0.11 mm, and a width $W_4$ at the utmost end of the strip electrode 56 formed at an outer portion 54 is 1.00 mm.

Figure 15:
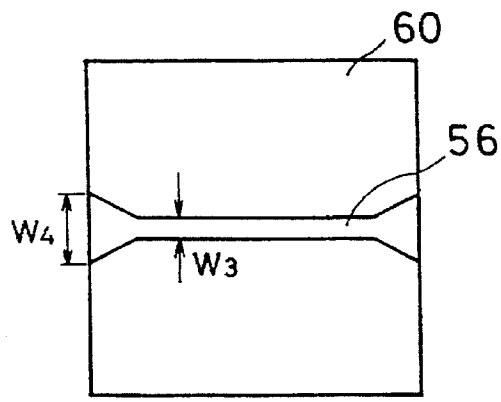
FIG. 15 is a plan view showing a state wherein a stripline is formed on a dielectric substrate which is formed by one kind of raw material.

For comparison, a single component dielectric substrate 60 was prepared by using the raw materials of No. 8, and the strip electrode 56 having a same size as that formed on the dielectric substrate 50 of the present invention was formed as shown in FIG. 15.

For these striplines, a reflection coefficient Γ was measured by using a measuring system of 50 Ω order. As a result, in the comparative example Γ=0.34 against Γ=0.00 for those using the dielectric substrate 50 of the present invention.

Accordingly, when the dielectric ceramics of the present invention is used, a monolithic IC which can be easily contacted to the outside while keeping impedance matching can be obtained. That is, the strip electrode 56 formed at the outer portion 54 can be used as a conductive portion for connecting to external circuits. Besides, since the line width of the strip electrode 56 can be reduced at the center portion 52 of the dielectric substrate 50, it is possible to obtain a small-sized monolithic IC.

A portion 58 where the dielectric constant is inclined may be formed at one corner of the dielectric substrate 50 or along one side thereof as shown in FIG. 16(A) and FIG. 16(B).

FIG. 17 is a perspective view showing an example in which the dielectric ceramics of the present invention is applied in a polarizer. The dielectric block 70 includes a columnar portion 72, at opposite ends of which conical portions 74 are formed. In the dielectric block 70, as shown in FIG. 18(A), towards one direction parallel to a surface which is orthogonal to an axis of the columnar portion 72, there is an inclination portion 76 where the dielectric constant distribution is inclined. The inclination portion 76 is formed at a center portion of a section of the dielectric block 70. In this case, as shown in FIG. 18(B), the dielectric constant at the center portion of the inclination portion 76 is large and it becomes smaller towards both sides. On both sides of the inclination 76, portions 78 where the small dielectric constant is distributed uniformly are formed.

In such dielectric block 70, since it has the inclination portion 76, an interface having a large difference of dielectric constant does not occur. Accordingly, an interface wave is not produced, and a transmission loss is reduced. Besides, since there is a portion having a high dielectric constant in the dielectric block 70, the polarizer can be miniaturized.

For producing the dielectric block 70, $CaCO_3$, $MgCO_3$, $SnO_2$, $TiO_2$, $La_2O_3$ and $MnCO_3$ having a mean particle diameter of 1 to 2 μm and a purity of 99% or more were prepared as green raw materials. The green raw materials were weighed in the ratio shown in Table 5 to obtain fourteen kinds of mixed raw material. The mixed raw material was calcined in the air at 1150° C. for two hours to obtain fourteen kinds of calcined raw material.

The calcined raw materials were used to prepare fourteen kinds of green sheet in a same manner as producing the dielectric substrate 10. Then each of the green sheets was laminated and subjected to heat press to obtain a molded body. The molded body was fired in the air at 1370° C. for two hours to obtain fourteen kinds of sintered body, after burning organic components in the air at 400° C. The sintered body was cut into a size of 10×10×0.5 (mm) and an In-Ga electrode was formed, then the dielectric constants were measured and shown in Table 5.

For producing a dielectric block 70 the green sheets were laminated as shown in FIG. 19. At this time, a green sheet prepared by the raw materials of No. 14 was laminated to a thickness of 2.0 mm at a center portions, and on both sides thereof the green sheets prepared by the raw materials of No. 13 to No. 2 were respectively laminated one by one to a thickness of 0.1 mm. And, on both sides of the green sheet prepared by the raw materials of No. 2, a green sheet prepared by the raw materials of No. 1 was laminated to a thickness of 9.0 mm. In such a manner a block 80 was obtained. A width of the block 80 is 23.0 mm and its length is 46.0 mm.

The block 80 thus obtained was fired in the air at 1370° C. for two hours to obtain a block-shaped sintered body of 17×17×35 (mm), after burning organic components in the air at 400° C.

The sintered body was cut orthogonally to its axis to obtain a sample 90. Accordingly, in the sample 90 there is a portion 92 which is formed by the raw materials of No. 2 to No. 14, and on both sides thereof portions 94 which are formed by the raw materials of No. 1 are arranged. For the sample 90, composition analysis (line analysis) of Sn and Ca was carried out by an X-ray microanalyzer in a direction shown by the arrow X in FIG. 20(A). As a result, it was found that a composition distribution is as shown in FIG. 20(B). From the composition distribution and dielectric constant characteristics of the simple substance, it is clear that the sintered body has an inclined dielectric constant structure as shown in FIG. 21.

Next, a sintered body shown in FIG. 22(A) was subjected to peripheral grinding to obtain a columnar rod of 12 mm diameter as shown in FIG. 22(B), which was further cut into a length of 30 mm by a diamond cutter. The sintered body was machined, by grinding, into a conical shape at portions 5 mm apart from the opposite ends to obtain a dielectric block 70 as shown in FIG. 17.

For comparison, as shown in FIG. 23, a fluororesin plate of 30×12×2 (mm) which is formed into a triangular shape at portions 5 mm apart from the opposite ends was prepared. Meanwhile, for comparison a plate having a shape shown in FIG. 23 was prepared by using the raw materials of No. 11.

As an evaluation sample, samples inserted the dielectric block 70 of the present invention, fluororesin plate and plate using the raw materials of No. 11 into a wave guide of 12 mm inside diameter was prepared. Then, a circular polarization wave of 5 GHz having a phase difference of 90° between a horizontal polarization and a vertical polarization was incided to the evaluation samples. A loss produced in the polarizer and the phase difference between the horizontal polarization and vertical polarization of the wave passing through the polarizer were measured. The results are shown in Table 6.

As it is clear from Table 6, by using the dielectric ceramics of the present invention, a loss at interface of the dielectric block 70 is small, and since there is a portion of high dielectric constant the polarizer can be miniaturized.

The inclination portion 76 of the dielectric block 70 may be formed in plurality as shown in FIG. 24(A) and FIG. 24(B), or may be formed at a position spaced from the center as shown in FIG. 24(C). As a shape of the dielectric block 70, pyramidal portions may also be formed on both sides of a square columnar portion.

As such, when the dielectric ceramics of the present invention is used, electronic parts can be miniaturized. Besides, when used as a stripline device and a monolithic IC substrate, it is simple to contact to the other circuits, and in addition it is easy to match impedance. Besides, when this dielectric ceramics is used in the polarizer, a transmission loss caused by interface wave can be reduced.

While the present invention has been particularly described and shown, it is to be understood that such description is used merely as an illustration and example rather than limitation, and the spirit and scope of the present invention is determined solely by the terms of the appended claims.

TABLE 1

| DIELECTRIC CONSTANT ∈ | LINE WIDTH (mm) |
|---|---|
| 5 | 1.7462 |
| 10 | 0.9485 |
| 30 | 0.2369 |
| 50 | 0.0938 |
| 100 | 0.0172 |

TABLE 2

| NO. | MIXING RATIO (mol %) | | | | | | | DIELECTRIC CONSTANT ∈ |
|---|---|---|---|---|---|---|---|---|
| | BaCO$_3$ | CaCO$_3$ | MgCO$_3$ | NdO$_{3/2}$ | TiO$_2$ | SiO$_2$ | PbO$_{4/3}$ | |
| 1 | | | 50.72 | | 47.85 | 1.43 | | 15 |
| 2 | | 2.93 | 47.07 | | 50.00 | | | 20 |
| 3 | | 6.90 | 43.10 | | 50.00 | | | 25 |
| 4 | | 10.10 | 39.90 | | 50.00 | | | 30 |
| 5 | | 12.78 | 37.22 | | 50.00 | | | 35 |
| 6 | 0.50 | | | 41.50 | 58.00 | | | 40 |
| 7 | 2.00 | | | 40.00 | 58.00 | | | 45 |
| 8 | 4.00 | | | 38.00 | 58.00 | | | 55 |
| 9 | 9.00 | | | 31.00 | 58.00 | | 2.00 | 65 |

TABLE 3

| WIRE DIAMETER (mm) | SOLDERBILITY | |
|---|---|---|
| | PRESENT INVENTION | COMPARATIVE EXAMPLE |
| 1.0 | O | X |
| 0.5 | O | X |
| 0.3 | O | X |
| 0.1 | O | O |

TABLE 4

| No. | MIXING RATIO (mol %) | | | | DIELECTRIC CONSTANT |
| --- | --- | --- | --- | --- | --- |
|  | CaCO$_3$ | MgCO$_3$ | ZrO$_2$ | TiO$_2$ | ε |
| 1 |  | 50.00 | 4.60 | 45.40 | 10 |
| 2 |  | 50.00 | 2.30 | 47.70 | 15 |
| 3 | 2.93 | 47.07 |  | 50.00 | 20 |
| 4 | 6.90 | 43.10 |  | 50.00 | 25 |
| 5 | 10.10 | 39.90 |  | 50.00 | 30 |
| 6 | 12.78 | 37.22 |  | 50.00 | 35 |
| 7 | 15.08 | 34.92 |  | 50.00 | 40 |
| 8 | 17.10 | 32.90 |  | 50.00 | 45 |

TABLE 5

| No. | MIXING RATIO (mol %) | | | | ADDITIVE (wt %) | | DIELECTRIC CONSTANT |
| --- | --- | --- | --- | --- | --- | --- | --- |
|  | CaCO$_3$ | MgCO$_3$ | SnO$_2$ | TiO$_2$ | La$_2$O$_3$ | MnCO$_3$ | ε |
| 1 |  |  | 90.00 | 10.00 |  | 1.0 | 15 |
| 2 |  |  | 82.86 | 17.14 |  | 1.0 | 20 |
| 3 |  |  | 75.71 | 24.29 |  | 1.0 | 25 |
| 4 |  |  | 68.57 | 31.43 |  | 1.0 | 30 |
| 5 |  |  | 61.43 | 38.57 |  | 1.0 | 35 |
| 6 |  |  | 54.28 | 45.72 |  | 1.0 | 40 |
| 7 |  |  | 47.14 | 52.86 |  | 1.0 | 45 |
| 8 | 18.89 | 31.11 |  | 50.00 | 1.0 |  | 50 |
| 9 | 20.50 | 29.50 |  | 50.00 | 1.0 |  | 55 |
| 10 | 21.97 | 28.03 |  | 50.00 | 1.0 |  | 60 |
| 11 | 23.32 | 26.68 |  | 50.00 | 1.0 |  | 65 |
| 12 | 24.56 | 25.44 |  | 50.00 | 1.0 |  | 70 |
| 13 | 25.71 | 24.29 |  | 50.00 | 1.0 |  | 75 |
| 14 | 26.79 | 23.21 |  | 50.00 | 1.0 |  | 80 |

TABLE 6

|  | LOSS | PHASE DIFFERENCE |
| --- | --- | --- |
| PRESENT INVENTION | 0.09 dB | 9.4° |
| FLUORORESIN PLATE | 0.7 dB | 42.8° |
| No. 11 PLATE | 3.13 dB | 2.1° |

What is claimed is:

1. A dielectric ceramic article comprising:
a dielectric ceramic substrate having a main surface and a pair of end regions at opposite ends of said substrate, and a center region between the end regions; and
an electrode adhered to said dielectric ceramic substrate extending parallel to said main surface and extending across said end regions and said center region;
wherein each of said end regions has a composition that is different from position to position so that a dielectric constant within each of said end regions is lower toward the end of said dielectric ceramic substrate than toward the center region;
wherein said center region has a substantially uniform dielectric constant; and
wherein within each of said end regions said electrode is narrower near said center region than near the corresponding end of said dielectric substrate.

2. The dielectric ceramic article of claim 1, wherein each said dielectric constant is within the range of $7 \leq \epsilon \leq 90$.

3. A dielectric ceramic article in accordance with claim 1, wherein said dielectric constant within each said end region changes substantially only as a function of position.

4. A dielectric ceramic article in accordance with claim 1, wherein said dielectric constant within each said end region changes as a function of position, when each said end region is at a constant temperature.

5. A dielectric ceramic article in accordance with claim 2, wherein said dielectric constant within each said end region changes as a function of position, when each said end region is at a constant temperature.

6. A dielectric ceramic article in accordance with claim 1, wherein said dielectric constant within each said end region changes continuously as a function of position toward the end of the dielectric substrate.

7. A dielectric ceramic article in accordance with claim 1, wherein said dielectric constant within each said end region changes incrementally as a function of position toward the end of the dielectric substrate.

8. An article as in claim 1, wherein said electrode is positioned along said main surface.

9. An article as in claim 1, wherein said electrode is positioned within the interior of said substrate.

10. An article as in claim 1, wherein said end regions and center region include at least two different types of metal ions selected from the group consisting of Mg, Ca, Sr, Ba, Zn, Pb, Bi, Y, La, Ce, Nd, Sm, Gd, Er, Ti, Zr, Sn, Si and Mn ions.

11. An article as in claim 1, wherein a characteristic impedance formed by said electrode and said substrate is substantially the same at all points along said electrode.

12. An article as in claim 1, further comprising an earth electrode formed on another surface of said dielectric substrate and substantially parallel to said electrode.

13. An article as in claim 1, further comprising an earth electrode formed on another surface of said dielectric substrate and substantially parallel to said electrode.

14. An article as in claim 8, wherein a characteristic impedance formed by said electrode and said substrate is substantially the same at all points along said electrode.

15. An article as in claim 14, further comprising an earth electrode formed on another surface of said dielectric substrate and substantially parallel to said electrode.

16. An article as in claim 8, further comprising an earth electrode formed on another surface of said dielectric substrate and substantially parallel to said electrode.

17. An article as in claim 9, wherein a characteristic impedance formed by said electrode and said substrate is substantially the same at all points along said electrode.

18. An article as in claim 17, further comprising an earth electrode formed on another surface of said dielectric substrate and substantially parallel to said electrode.

19. An article as in claim 9, further comprising an earth electrode formed on another surface of said dielectric substrate and substantially parallel to said electrode.

* * * * *